(12) United States Patent
Chang et al.

(10) Patent No.: US 9,379,237 B1
(45) Date of Patent: Jun. 28, 2016

(54) LATERAL DIFFUSED METAL-OXIDE-SEMICONDUCTOR DEVICE

(71) Applicant: UNITED MICROELECTRONICS CORP., Hsin-Chu (TW)

(72) Inventors: Ming-Hui Chang, Tainan (TW); Wei-Ting Wu, Tainan (TW); Ming-Shing Chen, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/602,282

(22) Filed: Jan. 22, 2015

(51) Int. Cl.
| | |
|---|---|
| *H01L 29/66* | (2006.01) |
| *H01L 29/78* | (2006.01) |
| *H01L 29/08* | (2006.01) |
| *H01L 29/06* | (2006.01) |
| *H01L 29/10* | (2006.01) |
| *H01L 29/36* | (2006.01) |

(52) U.S. Cl.
CPC ........ *H01L 29/7816* (2013.01); *H01L 29/0649* (2013.01); *H01L 29/0653* (2013.01); *H01L 29/0692* (2013.01); *H01L 29/0865* (2013.01); *H01L 29/0882* (2013.01); *H01L 29/1095* (2013.01); *H01L 29/36* (2013.01)

(58) Field of Classification Search
CPC .................................................. H01L 29/7816
USPC .......................................................... 257/343
See application file for complete search history.

(56) References Cited

U.S. PATENT DOCUMENTS

| | | | |
|---|---|---|---|
| 6,979,864 B2 * | 12/2005 | Negoro | ........... H01L 21/823857 257/335 |
| 2012/0205738 A1 | 8/2012 | Yang | |
| 2014/0070315 A1 | 3/2014 | Levy | |

* cited by examiner

*Primary Examiner* — Anthony Ho
(74) *Attorney, Agent, or Firm* — Winston Hsu; Scott Margo

(57) ABSTRACT

A LDMOS includes a gate structure disposed on the surface of a semiconductor substrate, a source region having a first conductivity type, a drain region having the first conductivity type, an isolation region surrounding the source/drain regions, a doped region having a second conductivity type, and a base region having the second conductivity type formed in the doped region. The source/drain regions are respectively disposed on two sides of the gate structure. The doped region surrounds the isolation region, and the bottom of the doped region is deeper than the bottom of the isolation region. The base region is disposed at the surface of the semiconductor substrate.

13 Claims, 3 Drawing Sheets

LATERAL DIFFUSED METAL-OXIDE-SEMICONDUCTOR DEVICE

BACKGROUND OF THE INVENTION

1. Field of the Invention

The present invention relates generally to semiconductor devices, and more particularly relates to lateral diffused metal-oxide-semiconductor (LDMOS) devices.

2. Description of the Prior Art

Processing technologies and device structures for forming integrated circuits (ICs) are often implemented using a plurality of interconnected field effect transistors (FETs), also called metal-oxide-semiconductor (MOS) field effect transistors (MOSFETs), or simply MOS transistors or devices. A well-known subset of MOS transistors is referred to as lateral diffused metal-oxide-semiconductor (LDMOS) transistors or devices. Although the abbreviation "MOS" and the term "MOS device" literally refer to a device having a metal gate electrode and an oxide gate insulator, that term will be used throughout to refer to any semiconductor device that includes a conductive gate (whether metal or not) that is positioned over a gate insulator (whether oxide or other dielectric) which, in turn, is positioned over a semiconductor substrate. Accordingly, the term metal-oxide-semiconductor and the abbreviations "MOS" and "LDMOS" are used herein even though such devices may not employ just metals or oxides but conductive materials other than metals, and insulating materials other than oxides. Accordingly, as used herein, the terms MOS and LDMOS are intended to include such variations. Non-limiting examples of conductive materials suitable for use in MOS and LDMOS devices are metals, metal alloys, semi-metals, metal-semiconductor alloys or compounds, doped semiconductors, and combinations thereof. Non-limiting examples of insulating materials suitable for use in MOS and LDMOS devices are oxides, nitrides, oxy-nitrides mixtures, organic insulating materials and other dielectrics.

A typical MOS transistor includes a gate "control" electrode and spaced-apart source and drain electrodes between which a current can flow. A voltage applied to the gate controls the flow of current through a conductive channel region induced in the underlying semiconductor between the source and drain. In an LDMOS device, a drift space is provided between the channel region and the drain. In some cases a shallow trench isolation (STI) region or field oxide (e.g. made from an insulator such as an oxide or other dielectric material) is provided in the drift space between the channel region and the drain, in which case the channel current passes underneath the STI region. This type of LDMOS is called "field LDMOS".

However, there are still some problems in a conventional LDMOS device such as relatively high on-resistance of the device and inevitable parasitic loss due to parasitic capacitance. Therefore, there is a need to provide an improved LDMOS device so as to overcome aforementioned problems.

SUMMARY OF THE INVENTION

According to one embodiment of the present invention, a field LDMOS fabricated on a semiconductor substrate includes a gate structure disposed on the surface of the semiconductor substrate, a source region having a first conductivity type, a drain region having the first conductivity type, an isolation region surrounding the source region and the drain region, a doped region having a second conductivity type, and a base region having the second conductivity type formed in the doped region. The source/drain regions are respectively disposed on two sides of the gate structure. The doped region surrounds the isolation region, and the bottom of the doped region is deeper than the bottom of the isolation region. The base region is disposed at the surface of the semiconductor substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
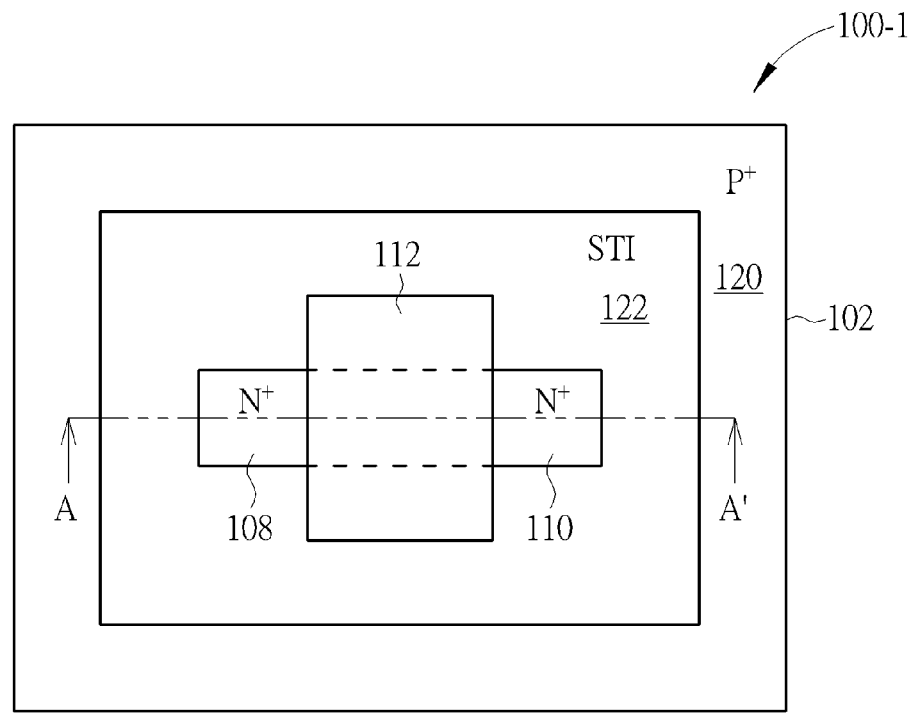
FIG. 1 is a schematic top view showing an LDMOS according to a first embodiment of the present invention.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that embodiments of the invention described herein are, for example, capable of operation or arrangement in sequences other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements, but may include other elements or steps not expressly listed or inherent to such process, method, article, or apparatus. As used herein the terms "substantial" and "substantially" mean sufficient to accomplish the stated purpose in a practical manner and that minor imperfections, if any, are not significant for the stated purpose.

As used herein, the term "semiconductor" may be interpreted to include any semiconductor such as single crystal semiconductor, poly-crystal semiconductor, amorphous semiconductor and combinations thereof, and to include type IV semiconductors, non-type IV semiconductors, compound semiconductors as well as organic and inorganic semiconductors. The terms "transistor" and "device" are used interchangeably herein.

Additionally, various device types and/or doped regions may be identified as being of N-type or P-type, but this is merely for convenience of description and not intended to be limiting, and such identification may be replaced by the more general description of being of a "first conductivity type" or of a "second, opposite conductivity type" where the first type may be either N-type or P-type and the second type is then either P-type or N-type. Some embodiments of the invention are illustrated herein for P-channel LDMOS devices or transistors, but this is merely for convenience of description and not intended to be limiting. Person of skill in the art will understand that N-channel LDMOS devices and other types of devices may be provided by appropriate substitution of semiconductor regions of opposite conductivity type.

Figure 2:
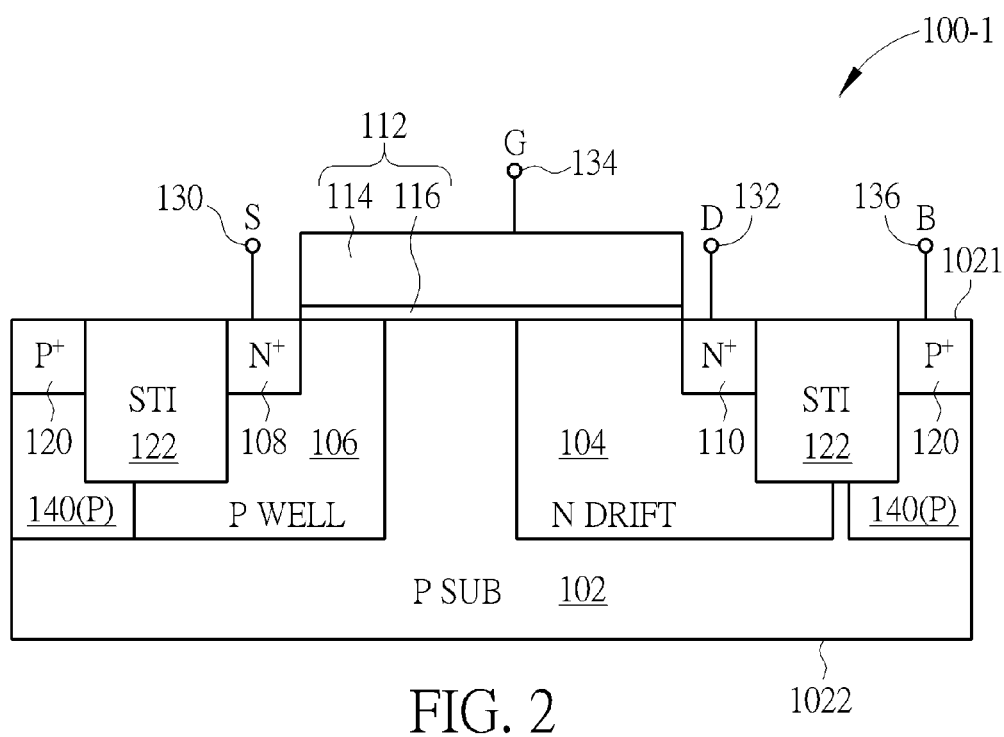
FIG. 2 is a schematic cross-sectional view taken along line A-A' in FIG. 1.

FIG. 1 is a schematic top view showing an LDMOS according to a first embodiment of the present invention, and FIG. 2 is a schematic cross-sectional view taken along line A-A' in FIG. 1. A lateral diffused metal oxide semiconductor (LDMOS) device depicted in FIG. 1 is an N-channel LDMOS device 100-1, which includes at least a P-type substrate 102 having a top surface 1021 and a bottom surface 1022, an N-type drift region 104 and a P-type well 106 formed in the P-type substrate 102, an N-type source region 108 formed in the P-type well 106, an N-type drain region 110 formed in the N-type drift region 104, a gate 112 disposed on the top surface 1021 of the P-type substrate 102, an isolation region 122, such as a shallow trench isolation (STI), surrounding the source/drain regions 108, 110, and a P-type base region 120 surrounding the source/drain regions 108, 110 and the isolation region 122. Both the N-type drift region 104 and the P-type well 106 are lightly doped regions compared to the heavily doped N-type source/drain regions 108, 110. Preferably, the isolation region 122 is a ring-shaped isolation region which encloses not only the source/drain regions 108, 110 but also the P-type substrate 102 underneath the gate 112, and the P-type base region 120 is also a ring-shaped base region which encloses both the source/drain regions 108, 110 and the isolation region 122.

Specifically, referring to FIG. 2, the gate 112 includes a gate electrode 114 and a gate oxide 116 sequentially stacked from bottom to top, which is used to define the channel length of a carrier channel in the P-type well 106 and the P-type substrate 102 underneath the gate oxide 116. Terminals 130, 132, 134, 136 may be respectively connected to the source region 108, the drain region 110, the gate 112, and the base region 120. When the gate 112 of the LDMOS device 100-1 is appropriately biased, current may flow from source terminal 130 and N-type source region 108 via N-type channel region in P-type well region 106 and the P-type substrate 102, through P-type drift region 104, and ultimately to N-type drain region 110 and drain terminal 132.

Besides, as shown in FIG. 2, in order to further reduce the contact resistance between the P-type base region 120 and the P-type substrate 102, a P-type doped region 140 is formed at the top surface 1021 of the P-type substrate 102. For example, the P-type doped region 140 is a ring-shaped doped region 140 surrounding the periphery of the isolation region 122. Preferably, the bottom of the P-type doped region 140 is deeper than the bottom of the isolation region 122 and substantially level with bottom of the P-type well 106 and the N-type drift region 104. Generally, the P-type doped region 140 is formed before forming the P-type base region 120, and the P-type base region 120 is shallower than the P-type doped region 140. In addition, the doping concentration of the P-type doped region 140 is greater than that of the P-type well region 106 and the N-type drift region 104. For example, the doping concentration of the P-type doped region 140 is preferably at least 3 times, and more preferably 10 times, greater than that of the P-type well region 106 and the N-type drift region 104. Also, an inner edge of the P-type doped region 140 shown in FIG. 2 may abut against an outer edge of the P-type well region 106 and may be spaced apart from an outer edge of the N-type drift region 104. However, the P-type doped region 140 may also abut against the outer edge of the N-type drift region 104 according to different requirements.

Figure 3:
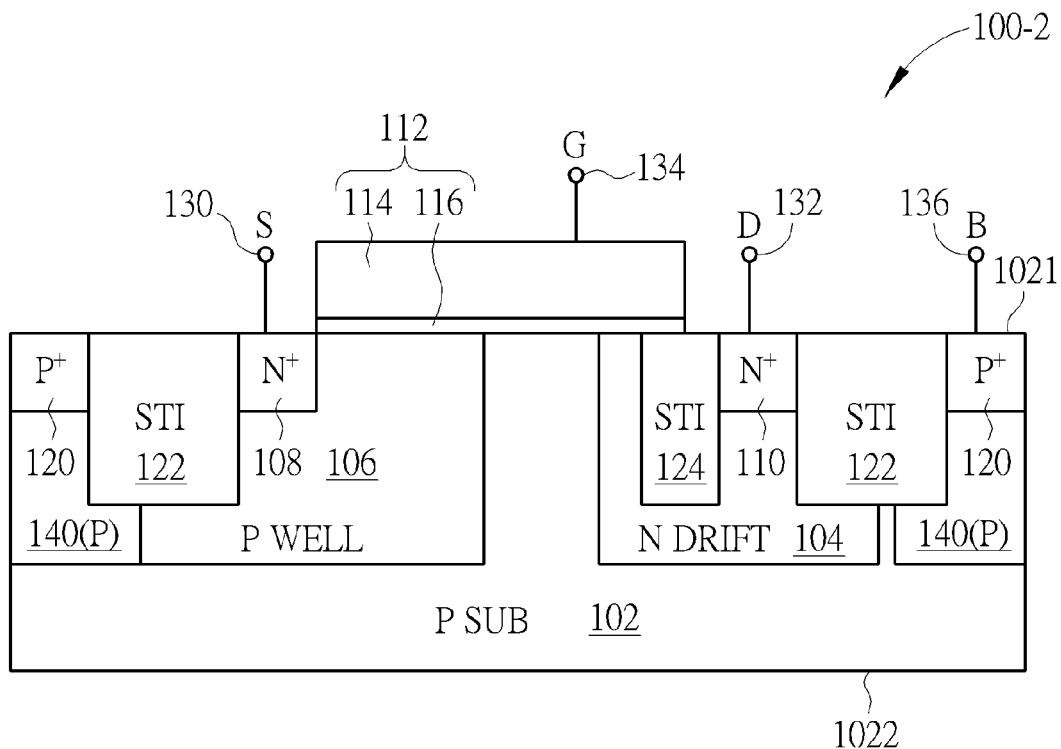
FIG. 3 is a schematic cross-sectional view showing an LDMOS according to a second embodiment of the present invention.

FIG. 3 is a schematic cross-sectional view showing an LDMOS according to a second embodiment of the present invention. Analogously, an LDMOS device depicted in FIG. 3 has a structure similar to the LDMOS shown in FIG. 2. The LDMOS shown in FIG. 3 is also an N-channel LDMOS device 100-2, which includes at least a P-type substrate 102 having a top surface 1021 and a bottom surface 1022, an N-type drift region 104 and a P-type well 106 disposed in the P-type substrate 102, an N-type source region 108 formed in the P-type well 106, an N-type drain region 110 formed in the N-type drift region 104, a gate 112 disposed on the top surface 1021 of the P-type substrate 102, an isolation region 122 surrounding the source/drain regions 108, 110, and a P-type base region 120 surrounding the source/drain regions 108, 110 and the isolation region 122. Both the N-type drift region 104 and the P-type well 106 are lightly doped regions compared to the heavily doped N-type source/drain regions 108, 110. Also, in order to further reduce the contact resistance between the P-type base region 120 and the P-type substrate 102, a P-type doped region 140 is formed in the P-type substrate 102. For example, the P-type doped region 140 is a ring-shaped doped region 140 surrounding the periphery of the isolation region 122. Preferably, the bottom of the P-type doped region 140 is deeper than the bottom of the isolation region 122 and substantially level with bottom of the P-type well 106 and the N-type drift region 104.

However, one main difference between the LDMOS 100-1 of the first embodiment and the LDMOS 100-2 of the second embodiment is that the LDMOS 100-2 of the second embodiment further includes another isolation region 124, such as a stripe-shaped STI, embedded in the N-type drift region 104. The isolation region 124 shown in FIG. 3 may partially overlap the gate structure 112 and abut against the N-type drain region 110. The purpose of the isolation region 124 is to increase the flowing path of the current between the source/drain regions 108, 110. Specifically, the current from the N-type source region 108 may flow down along an edge of the isolation region 124 close to the N-type source region 108, then flow beneath the isolation region 124, and finally flow up along an edge of the isolation region 124 far away from the N-type source region 108 until the current reaches the N-type drain region 110.

Figure 4:
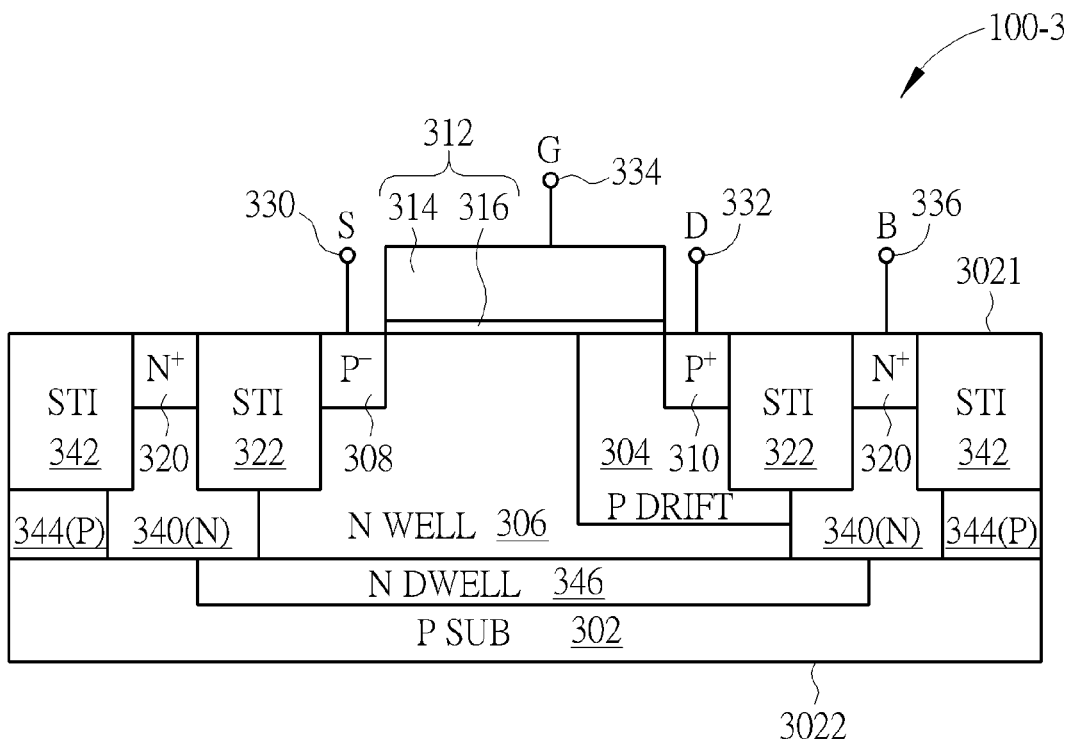
FIG. 4 is a schematic cross-sectional view showing an LDMOS according to a third embodiment of the present invention.

FIG. 4 is a schematic cross-sectional view showing an LDMOS according to a third embodiment of the present invention. An LDMOS device depicted in FIG. 4 is an P-channel LDMOS device 100-3, which includes at least a P-type substrate 302 having a top surface 3021 and a bottom surface 3022, a P-type drift region 304 and an N-type well 306 formed in the P-type substrate 302, a P-type source region 308 formed in the N-type well 306, a P-type drain region 310 formed in the P-type drift region 304, a gate 312 disposed on the top surface 3021 of the P-type substrate 302, an isolation region 322, such as a STI, surrounding the source/drain regions 308, 310, and an N-type base region 320 surrounding the source/drain regions 308, 310 and the isolation region 322. Both the P-type drift region 304 and the N-type well 306 are lightly doped regions compared to the heavily doped P-type source/drain regions 308, 310. Preferably, the isolation region 322 is a ring-shaped isolation region enclosing the source/drain regions 308, 310, and the N-type base region 320 is a ring-shaped base region enclosing the source/drain regions 308, 310 and the isolation region 322. In addition, the P-type drift region 304 is formed in the N-type well 306, and an N-type deep well 346 is further formed in the P-type substrate 302 underneath the N-type well 306. The P-channel LDMOS device 100-3 further includes another ring-shaped isolation region 342 in the P-type substrate 302, and the ring-shaped isolation region 342 surrounds the isolation region 322 and the base region 320.

Specifically, referring to FIG. 4, the gate 312 also includes a gate electrode 314 and a gate oxide 316, which is used to define a carrier channel region in the N-type well 306 underneath the gate oxide 316. Terminals 330, 332, 334, 336 may be respectively connected to the source region 308, the drain region 310, the gate 312, and the base region 320. When the gate 312 of the LDMOS device 100-3 is appropriately biased, current flows from source terminal 330 and P-type source region 308 via P-type channel region in N-type well region 306, through N-type drift region 304, and ultimately to P-type drain region 310 and drain terminal 332.

Analogously, in order to further reduce the contact resistance between the N-type base region 320 and the N-type well 306, an N-type doped region 340 is formed in the P-type substrate 302, which is preferably in direct contact with an outer edge of the N-type well region 306 and the top of the N-type deep well 346. Specifically, the N-type doped region 340 is a ring-shaped doped region surrounding the periphery of the isolation region 322. Preferably, the bottom of the N-type doped region 340 is deeper than the bottom of the isolation regions 322, 342, and substantially level with the bottom of the N-type well 306. Generally, the N-type doped region 340 is formed before forming the N-type base region 320, and the N-type base region 320 is shallower than the N-type doped region 340. In addition, the doping concentration of the N-type doped region 340 is greater than that of the N-type well region 306 and the P-type drift region 304. For example, the doping concentration of the N-type doped region 340 is preferably at least 3 times, and more preferably 10 times, greater than that of the N-type well region 306 and the P-type drift region 304. Also, although an inner edge of the N-type doped region 340 shown in FIG. 4 may abut against an outer edge of the P-type drift region 304. However, the N-type doped region 340 may also be spaced apart from the P-type drift region 304 according to different requirements.

Figure 5:
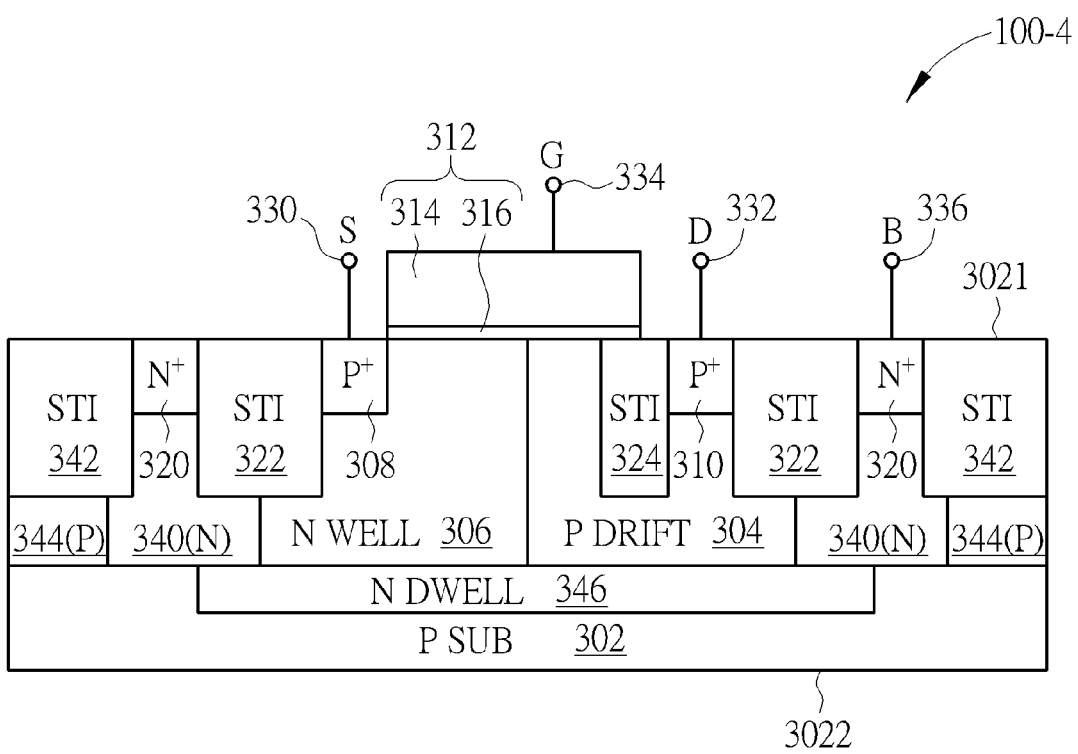
FIG. 5 is a schematic cross-sectional view showing an LDMOS according to a fourth embodiment of the present invention.

FIG. 5 is a schematic cross-sectional view showing an LDMOS according to a fourth embodiment of the present invention. Analogously, an LDMOS device depicted in FIG. 5 has a structure similar to that of the LDMOS shown in FIG. 4. The LDMOS shown in FIG. 5 is also an N-channel LDMOS device 100-4, which includes at least a P-type substrate 302 having a top surface 3021 and a bottom surface 3022, a P-type drift region 304 and an N-type well 306 disposed in the P-type substrate 302, a P-type source region 308 formed in the N-type well 306, a P-type drain region 310 formed in the P-type drift region 304, a gate 312 disposed on the top surface 3021 of the P-type substrate 302, an isolation region 322 surrounding the source/drain regions 308, 310, and an N-type base region 320 surrounding the source/drain regions 308, 310 and the isolation region 322. Both the P-type drift region 304 and the N-type well 306 are lightly doped regions compared to the P-type source/drain regions 308, 310. Preferably, the isolation region 322 is a ring-shaped isolation region enclosing the source/drain regions 308, 310, and the N-type base region 320 is a ring-shaped base region enclosing the source/drain regions 308, 310 and the isolation region 322. Also, an N-type deep well 346 is formed in the P-type substrate 302 in direct contact with the N-type well 306 and the P-type drift region 304. The P-channel LDMOS device 100-4 includes another ring-shaped isolation region 342 in the P-type substrate 302, and the ring-shaped isolation region 342 surrounds the isolation region 322 and the base region 320.

Specifically, referring to FIG. 5, the gate 312 includes a gate electrode 314 and a gate oxide 316, which is used to define a carrier channel region in the N-type well 306 underneath the gate oxide 316. Terminals 330, 332, 334, 336 may be respectively provided to the source region 308, the drain region 310, the gate 312, and the base region 320. When the gate 312 of the LDMOS device 100-3 is appropriately biased, current flows from source terminal 330 and P-type source region 308 via P-type channel region in N-type well region 306, through N-type drift region 304, and ultimately to P-type drain region 310 and drain terminal 332.

Also, in order to further reduce the contact resistance between the N-type base region 320 and the N-type well 306, an N-type doped region 340 is formed in the P-type substrate 302, which is preferably in direct contact with an outer edge of the N-type well region 306 and the top of the N-type deep well 346. Specifically, the N-type doped region 340 is a ring-shaped doped region surrounding the periphery of the isolation region 322. Preferably, the bottom of the N-type doped region 340 is deeper than the bottom of the isolation regions 322, 342, and substantially level with the bottom of the N-type well 306. Generally, the N-type doped region 340 is formed before forming the N-type base region 320, and the N-type base region 320 is shallower than the N-type doped region 340. In addition, the doping concentration of the N-type doped region 340 is greater than that of the N-type well region 306 and the P-type drift region 304. For example, the doping concentration of the N-type doped region 340 is preferably at least 3 times, and more preferably 10 times, greater than that of the N-type well region 306 and the P-type drift region 304. Also, although an inner edge of the N-type doped region 340 shown in FIG. 5 may abut against an outer edge of the P-type drift region 304. However, the N-type doped region 340 may also be spaced apart from the P-type drift region 304 according to different requirements.

One main difference between the LDMOS 100-3 of the third embodiment and the LDMOS 100-4 of the fourth embodiment is that the LDMOS 100-4 of the fourth embodiment further includes still another isolation region 324 embedded in the P-type drift region 304. The isolation region 324 shown in FIG. 5 partially overlaps the gate structure 312 and abutted against the P-type drain region 310. The purpose of the isolation region 324 is to increase the flowing path of the current between the source/drain regions 308, 310. Specifically, the current from the P-type source region 308 may flow down along an edge of the isolation region 324 close to the P-type source region 308, then flow beneath the bottom of the isolation region 324, and finally flow up along an edge of the isolation region 324 far away from the P-type source region 308 until the current reaches the P-type drain region 310.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An LDMOS transistor fabricated on a semiconductor substrate, the transistor comprising:
   a gate structure disposed on the surface of the semiconductor substrate;
   a source region having a first conductivity type disposed at the surface of the semiconductor substrate on a side of the gate structure;
   a drain region having the first conductivity type disposed at the surface of the semiconductor substrate on another side of the gate structure;
   an isolation region surrounding the source region and the drain region, wherein the isolation region is a ring-shaped isolation region;
   a doped region having a second conductivity type surrounding the isolation region, wherein the bottom of the doped region is deeper than the bottom of the isolation region; and
   a base region having the second conductivity type formed in the doped region at the surface of the semiconductor substrate.

2. The transistor of claim 1, wherein the base region is a ring-shaped base region.

3. The transistor of claim 1, further comprising:
   a well region having the second conductivity type disposed in the semiconductor substrate, wherein the source region is formed in the well region; and
   a drift region having the first conductivity type disposed in the semiconductor substrate, wherein the drain region is formed in the drift region.

4. The transistor of claim 3, wherein the well region and the drift region are surrounded by the isolation region.

5. The transistor of claim 3, wherein a doping concentration of the doped region is greater than a doping concentration of the well region and a doping concentration of the drift region.

6. The transistor of claim 5, wherein the doping concentration of the doped region is at least 3 times greater than the doping concentration of the well region.

7. The transistor of claim 5, wherein the doping concentration of the doped region is at least 3 times greater than the doping concentration of the drift region.

8. The transistor of claim 3, wherein a doping concentration of the doped region is 10 times greater than a doping concentration of the well region and a doping concentration of the drift region.

9. The transistor of claim 3, wherein the doped region is in indirect contact with an edge of the well region.

10. The transistor of claim 3, wherein the doped region is in indirect contact with an edge of the drift region.

11. The transistor of claim 3, wherein the drift region is formed in the well region.

12. The transistor of claim 3, further comprising another isolation region embedded in the drift region, wherein the isolation region being embedded in the drift region partially overlaps the gate structure.

13. The transistor of claim 3, further comprising another isolation surrounding the base region.

* * * * *